US006094109A

United States Patent [19]

Greene et al.

[11] Patent Number: 6,094,109

[45] Date of Patent: Jul. 25, 2000

[54] POWER TAKEOFF INDUCTOR

[75] Inventors: Clarke V. Greene, Middletown; Leonel Espirito Santo, Newington, both of Conn.

[73] Assignee: ADC Telecommunications, Inc., Minnetonka, Minn.

[21] Appl. No.: 08/946,157

[22] Filed: Oct. 7, 1997

Related U.S. Application Data

[63] Continuation-in-part of application No. 08/398,991, Mar. 6, 1995, abandoned.

[51] Int. Cl.[7] ............................ H03H 7/09; H01F 27/24; H01F 27/30

[52] U.S. Cl. .......................... 333/181; 333/185; 336/212; 336/221; 336/233

[58] Field of Search .................................... 336/233, 212, 336/195, 234, 221; 333/181, 185

[56] References Cited

U.S. PATENT DOCUMENTS

| | | | |
|---|---|---|---|
| 1,982,689 | 12/1934 | Polydoroff | 336/233 |
| 3,305,811 | 2/1967 | Toombs | 336/212 |
| 3,423,710 | 1/1969 | Allen | 336/212 |
| 3,739,255 | 6/1973 | Leppert | 336/212 |
| 3,781,740 | 12/1973 | Kirmis et al. | 336/233 |
| 4,641,115 | 2/1987 | Bailey | 336/195 |
| 4,656,451 | 4/1987 | Pomponio | 336/212 |
| 5,032,808 | 7/1991 | Reddy . | |
| 5,047,743 | 9/1991 | Scesney . | |

FOREIGN PATENT DOCUMENTS

| | | |
|---|---|---|
| 2290799 | 6/1976 | France . |
| 1 174 858 | 7/1964 | Germany . |
| 33 44 830 A1 | 6/1985 | Germany . |
| 42 41 604 A1 | 6/1994 | Germany . |

OTHER PUBLICATIONS

Product literature of Fair–Rite Products Corp., pp. 92 and 93 (No date).

Article of a product of Ferronics Inc., Fairport, New York pertaining to a Z–MAX® choke, (No date).

*Primary Examiner*—Thomas J. Kozma
*Attorney, Agent, or Firm*—Merchant & Gould P.C.

[57] ABSTRACT

A power takeoff inductor is an inductor comprised of a hybrid core. Materials with varying low and high permeabilities are combined to create a common hybrid core for the inductor. The inductor can be used in power transmission systems where signals of lower frequencies are transmitted along the same conductors with signals extending across a broad range of higher frequencies. The inductor is used to extract signals having low frequencies without degrading other high frequency signals.

8 Claims, 2 Drawing Sheets

POWER TAKEOFF INDUCTOR

This is a Continuation-in-Part of application Ser. No. 08/398,991, filed Mar. 6, 1995 now abandoned.

I. BACKGROUND OF THE INVENTION

1. Field of the Invention

This invention pertains principally to signal transmission systems. More particularly, this invention pertains to a power takeoff inductor for such a system. Further, this invention pertains to a novel inductor design.

2. Background of the Invention

In signal transmission systems (such as CATV systems or hybrid fiber coax telephony systems), a signal is transmitted over a wide range of frequencies. For example, the signal may be carried over a radio frequency spectrum from below 5 Megahertz to above 1 Gigahertz. Commonly, such signals are carried over coax cables having a signal conductor surrounded by a grounded shield. In addition to carrying the signal transmission, the signal conductor will also carry a power transmission. In a typical application, power is transmitted over the signal conductor at about 60 Hertz and at a voltage between 30 and 90 volts RMS. The signal transmission is typically carried at less than 1 volt RMS.

In field applications of such signal transmission systems, it is necessary to extract the 60 Hertz power transmission without degradation of the radio frequency signals. Devices used to extract the power transmission must present a low impedance to the 60 Hertz power transmission while presenting a high impedance to the radio frequency (RF) signals. This is normally performed by an inductor (alternatively referred to as a choke) shunted directly across the incoming coaxial cable. For typical applications as referenced above, the inductor must be capable of passing in excess of 15 amperes of 60 Hertz power transmission. Also, power may be reinserted in the field for distribution to subsequent field locations in the transmission system.

A difficulty frequently encountered in power takeoff in signal transmission systems is that the inductor must present a high impedance across the entire radio frequency spectrum at which the signal is being transmitted (i.e., in the example given the inductor must present a high impedance from about 5 Megahertz to 1 Gigahertz) to avoid partially shorting the desired signal. Inductors for drawing off the power signal are available in a wide range of sizes, geometries and physical attributes. For example, such an inductor may be a coil which is air-wound (i.e., has no magnetic loading by reason of a magnetically permeable core disposed within the winding). For the applications thus described, an air-wound inductor would be prohibitively large. Also, such an inductor would require a very large number of windings to attain suitable inductance values. Moreover, the distributed capacitance between the windings of such an inductor would result in resonant circuits.

It is well known to magnetically load an inductor through use of a magnetic permeable core placed within the winding of the inductor. A magnetic permeable core affects the magnetic field of the inductor by compressing the magnetic flux lines of the magnetic field.

The use of a magnetically permeable core raises the inductance of the inductor. As a result, a physically smaller inductor with fewer windings can be used to attain the same inductance and impedance of a much larger air-wound inductor. Also, due to the fact there are fewer windings, there is less opportunity for resonance resulting from a capacitance effect between opposing surfaces of the windings. Such resonances can reduce the impedance at their natural frequencies and can degrade RF signals at these frequencies. Also, in CATV applications, a smaller length of the inductor reduces the total low frequency resistance of the inductor. This reduces the loss of the power signal which would otherwise be caused by heating of the inductor due to high currents of the power signal.

For effective loading at the lower end (i.e., 5 Megahertz in the above example) of the frequency range, high magnetic permeability material is required. Unfortunately, such materials typically present high circuit losses at high frequencies. Conversely, materials that offer good high frequency loss characteristics have lower permeability and are less effective at the low end of the frequency. Commonly, in designing power takeoffs, a compromised design is selected where a compromised material of intermediate permeability is used that has a reasonable permeability at low frequency but reasonable losses at high frequencies. Nevertheless, the design is compromised resulting in losses at high frequencies.

An alternative to a compromised inductor design is a so-called Pi-wound inductor. A Pi-wound inductor has a common core with a gap placed in the winding to move resonances out of the frequency bands. Another option is to place two inductors of different inductive values in series. One of the inductors is tuned to the low frequency (i.e., 5 Megahertz in the above example). The other is tuned to the higher frequency (i.e., 1 Gigahertz). However, it is believed these options still present a compromised design with respect to intermediate frequencies in the frequency range.

II. SUMMARY OF THE INVENTION

According to a preferred embodiment of the present invention, an inductor is disclosed having a coiled conductor extending from a first end to a second end and defining a winding. A core is disposed within the winding. The core has a varying magnetic permeability varying from a first end of the core to a second end of the core. The present invention also includes a signal transmission system having a signal conductor for carrying a signal over a frequency range between a low signal frequency and a high signal frequency. The signal conductor further carries a power transmission at a power frequency less than the low signal frequency. The transmission system includes a power takeoff in the form of an inductor having a core disposed within a winding. A first end of the winding is connected to the signal conductor and a second end of the winding is connected to a power takeoff conductor. The core disposed within the winding has a magnetic permeability which varies from the first end of the core to the second end of the core. In one preferred embodiment, the core of the inductor comprises a plurality of individual core components which are serially disposed in a direction from the first end to the second end. An alternative embodiment of the inductor incudes individual core components separated by dielectric spacers. In the alternative embodiment, it is preferred that the core components all have the same magnetic permeability

III. BRIEF DESCRIPTION OF THE DRAWINGS

IV. DETAILED DESCRIPTION OF THE PREFERRED EMBODIMENT

With reference now to the various drawing figures in which identical elements are numbered identically throughout, a description of the preferred embodiment of the present invention will now be provided.

Figures 1, 2, 3, 4:
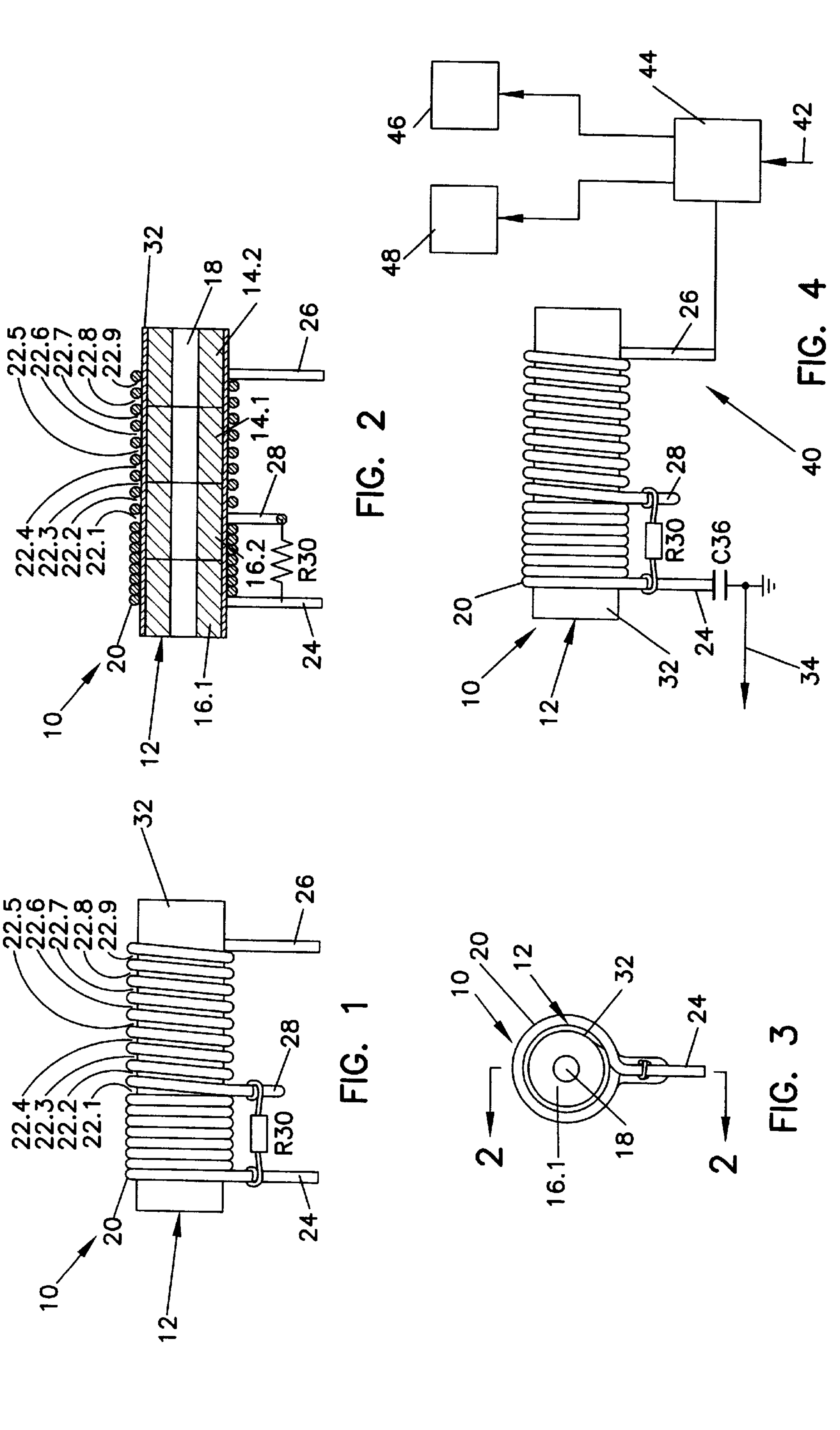
FIG. 1 shows a side view of a power takeoff inductor according to the present invention.
FIG. 2 shows a side sectional view of the power takeoff inductor shown in FIG. 1.
FIG. 3 shows an end view of the power takeoff inductor shown in FIG. 1.
FIG. 4 is a schematic representation of a signal transmission system utilizing the power takeoff inductor shown in FIGS. 1 through 3.

With initial reference to FIG. 1, a power takeoff inductor 10 is shown. A conductor 20 is coiled around a core rod 12 as is well known in the art. In the preferred embodiment the coiled conductor 20 is tightly wound around a first portion of the core rod 12 without physical gaps between the windings. The coiled conductor 20 is wound around a second portion of the core rod 12 with a physical gap 22.1, 22.2, 22.3, 22.4, 22.5, 22.6, 22.7, 22.8 and 22.9 between each of the windings. The physical gaps 22 are provided between turns of the coiled conductor 20 to reduce the distributed capacitance between the windings and thereby reduce the resonance. The preferred embodiment uses well-known and commercially available #18 enameled copper for the coiled conductor 20. However, it will be apparent to those in the art that many types of wires could be used for the coiled conductor 20.

A first coil lead 24 is connected to an elongated coil turn 28 by means of a resistor 30. In the preferred embodiment the elongated coil turn 28 is the coil turn between the first portion of the core rod 12 and the second portion of the core rod 12. The resistor 30 is used to dampen out resonance in lower frequencies of the signals passing through the power takeoff inductor 10. The use of a resistor to create this effect in an inductor is well known in the art. It will be apparent to one skilled in the art that the optimum resistor value will depend upon the particular application.

Referring now to FIGS. 2 and 3, a side sectional view of the power takeoff inductor 10 and an end view of the power takeoff inductor 10 are shown respectively. The core rod 12 is comprised of a combination of beads 14.1, 14.2, 16.1 and 16.2. Each of the beads 14.1, 14.2, 16.1 and 16.2 is substantially cylindrical with an axial hole along a longitudinal axis of the beads. The beads 14.1, 14.2, 16.1 and 16.2 are placed end to end and are encapsulated in heat shrink tubing 32 to form the elongated core rod 12. The core rod 12 is disposed within the coiled conductor 20, as is well known in the art. When the beads are placed end to end to form the core rod 12, the holes within the beads combine to form a longitudinal hole 18 within the core rod 12.

In the preferred embodiment, the beads 14.1 and 14.2 are made of a material having low permeability, while the beads 16.1 and 16.2 are made of a material having high permeability. In the preferred embodiment, the low permeability beads 14.1 and 14.2 have an initial permeability of 850 H/m and are commercially available from and manufactured by Fair-Rite Products Corp., P.O. Box J, One Commercial Row, Wallkill, N.Y. 12589, part number 2643000801. The high permeability beads 16.1 and 16.2 have an initial permeability of 2500 H/m and are also commercially available from and manufactured by Fair-Rite Products Corp. of New York, part number 2673000801.

The longitudinal holes formed through the beads 14.1, 14.2, 16.1 and 16.2 are generally used to place a wire conductor therethrough. This invention, however, does not require a wire conductor through its core rod 12. Therefore, the longitudinal hole 18 formed by placement of the hollow beads 14.1, 14.2, 16.1 and 16.2 end to end, is unnecessary to the effectiveness of the power takeoff inductor 10. It will thus be apparent to those skilled in the art, that the beads 14.1, 14.2, 16.1 and 16.2 could be solid rather than hollow. In addition, it will be further apparent to those in the art that a single manufactured material having appropriately varying permeability could be utilized as the core rod 12. Finally, it will also be apparent that the core rod 12 could comprise any number of beads so long as, in combination, they define a core rod with appropriately varying permeability.

Referring now to FIG. 4, a signal transmission system 40 has a signal conductor 42 for carrying a power signal at a lower frequency and for carrying high frequency signals over a frequency range higher than the power frequency. As shown in FIG. 4, the signal conductor 42 is electrically connected to output field equipment 44. The output field equipment 44 is electrically connected to other field equipment 46 further down the transmission system 40. The output field equipment 44 is also connected to high frequency signal receivers 48, that receive the signals transmitted over the higher frequency range. The second coil lead 26 of the power takeoff inductor 10 is electrically connected to the signal conductor 42 at the output field equipment 44 for extracting the power signal from the higher frequency signals. The first coil lead 24 of the power takeoff inductor 10 is grounded through a capacitor 36. This configuration is known in the art for filtering out the signals in a higher frequency range, commonly referred to as a high frequency by-pass. The use of a capacitor for this purpose is well known in the art. It will be obvious to those skilled in the art that the capacitor can have many different values, and the optimum capacitor value will depend upon the particular application. The first coil lead 24 is also electrically connected to a power conductor 34 through which the power signal is transmitted.

In a signal transmission system as shown in FIG. 4, the high frequency signals are transmitted via a signal conductor 42 to the output field equipment 44. Such high frequency signals can be, for example, radio frequency signals that are less than 1 volt RMS and range in frequency from about 5 Megahertz to 1 Gigahertz. The same signal conductor 42 is also used to transmit the power signal for field deployed equipment 46. A typical power signal could be a 60 hertz quasi sine wave between 30 and 90 volts RMS. The power takeoff inductor 10 is electrically connected to the signal conductor 42 for filtering off the power signal without degrading the high frequency signals. Thus, the high frequency signals such as radio frequency signals, will be transmitted to high frequency signal receivers 48 and possibly to other field equipment 46.

The combination of materials forming the core rod 12 presents a high impedance across the frequency range of signals transmitted on the signal conductor 42. This is accomplished by the use of the low permeability beads 14.1 and 14.2 connected to the high permeability beads 16.1 and 16.2 and forming the core rod 12. The lower permeability of the low permeability beads 14.1 and 14.2 offers good high frequency characteristics, such as a high impedance at high frequencies, because of their low loss. The higher permeability of the high permeability beads 16.1 and 16.2 offers a high impedance at lower frequencies. Thus, the combination of the high permeability beads 16.1 and 16.2 and the low permeability beads 14.1 and 14.2 results in high impedance across the frequency range. Because the low permeability beads 14.1 and 14.2 are coupled magnetically to the high permeability beads 16.1 and 16.2, the core rod 12 offers good intermediate frequency characteristics as well. In addition, the combination of low permeability beads 14.1 and 14.2 together with high permeability beads 16.1 and 16.2 defining the core rod 12 minimizes resonance in the power takeoff inductor 10. Because the present invention is one inductor without an electrical connection to other inductors, the resonance caused by such electrical connections is eliminated.

The first coil lead 24 is grounded through the capacitor 36 and filters out the high frequency signals, as is common in the art. The lower frequency power signal is then transmitted through the power conductor 34. The power conductor 34 can be distributed to other field equipment 46 located further down the transmission system 40, by connecting the power conductor 34 to the output of the output field equipment 44.

Figure 5:
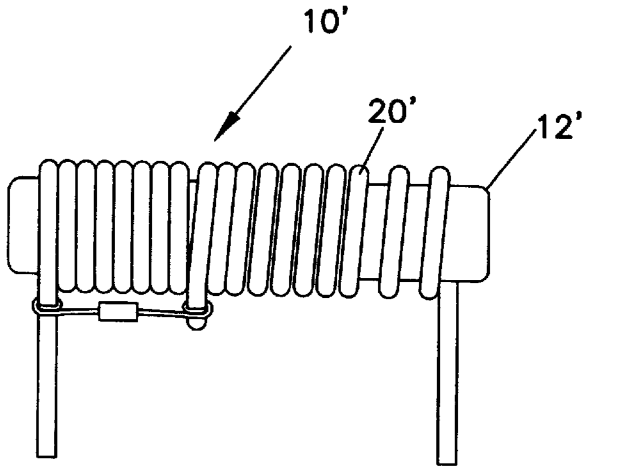
FIG. 5 is the view of FIG. 1 showing an alternative embodiment of a power takeoff inductor according to the present invention.
Figure 6:
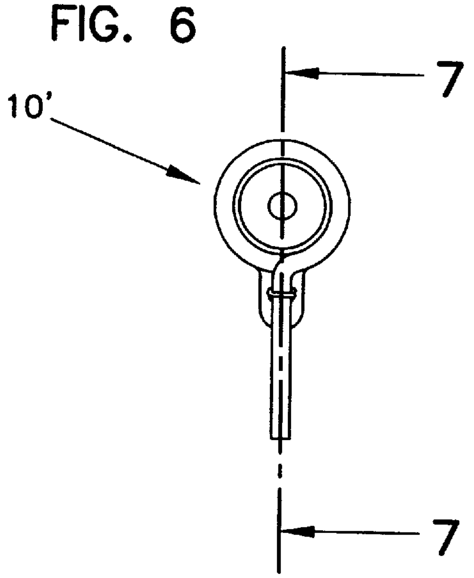
FIG. 6 shows an end view of the inductor of FIG. 5.
Figure 7:
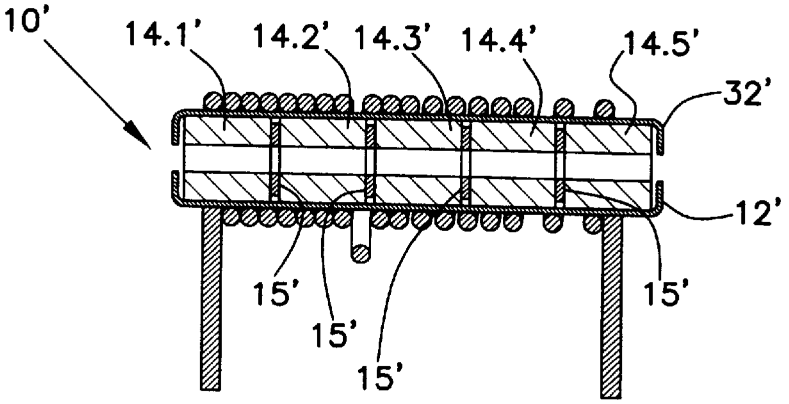
FIG. 7 shows a view taken along lines 7—7 of FIG. 6.

FIGS. 5–7 show an alternative embodiment of an inductor 10 elements in common with those in FIGS. 1–4 are numbered identically with the addition of an apostrophe to distinguish the embodiment. The inductor 10' includes a conductor 20' coiled around a core rod 12'. A first portion of the coiled conductor 20' is wound without gaps and a second portion is wound with gaps between the windings. As shown in FIG. 7, the inductor 10 includes a core rod 12' comprised of a plurality of beads 14.1 ' through 14.5'. Each of the beads is identical and is substantially cylindrical with an axial hole along the longitudinal axis of the beads. The beads are separated by a plurality of nylon spacers 15' positioned between opposing axial faces of the beads 14.1' through 14.5'. The beads 14.1' through 14.5' and spacers 15' are encapsulated in a heat shrink tubing 32 to form the elongated core rod 12'.

Unlike the embodiment of FIGS. 1–4, the beads 14.1' through 14.5' preferably have the same magnetic permeability which, in the preferred embodiment, is 2500 H/m. The nylon spacers 15' are flat washers having an outside diameter of 0.250 inches which is less than the outside diameter of the beads 14.1' through 14.5' and with a hole having an inside diameter to match the holes of the beads. The nylon washers are 0.062 inches thick.

The purpose of the nylon washers 15' is to provide a dielectric spacing between the beads 14.1' through 14.5'. In the absence of the spacing, the beads 14.1' through 14.5' can achieve a Curie saturation wherein the beads no longer hold magnetic properties. The spacing 15' maintains the core 12' as a single core but partially magnetically decouples the beads 14.1' through 14.5' to prevent the Curie saturation in the application described herein.

The power takeoff inductor 10 permits extraction of a low frequency power signal without degrading the higher frequency signals that are being transmitted on the same transmission line. While the invention has been disclosed in the preferred embodiment for the purpose of illustration, it will be appreciated that modifications and equivalents of the disclosed concept may be apparent to those skilled in the art having the benefit of the teachings of the present invention. It is intended that the scope of the present invention not be limited by the specific embodiment shown above but shall include such modifications and equivalents.

What is claimed is:

1. A signal transmission system comprising:

a) a power source for generating a power signals said power source including a signal conductor simultaneously carrying said power signal and a transmission signal; and b) a power takeoff inductor including:

i) a coiled conductor longitudinally extending from a first end to a second end and defining a winding, one of said first and second conductor ends connected to said signal conductor for drawing said power signal off of said signal conductor; and ii) a core longitudinally extending from a first end to a second end, said core disposed axially within said winding, said core first end adjacent said conductor first end and said core second end adjacent said conductor second end, said core comprising at least three individual core components having different magnetic permeability, each of which has a longitudinal hole, the core components being serially aligned to each other and longitudinally disposed from said core first end to said core second end, which forms a longitudinal hole from the core first end to the core second end;

said coiled conductor receiving said power signal from said signal conductor without substantially degrading said transmission signal, and said inductor including a plurality of dielectric spacers between said at least three individual core components, each of the two immediately adjacent core components having at least one of the dielectric spacers therebetween.

2. The signal transmission system according to claim 1 wherein said at least three individual core components are discs of magnetic permeable material disposed in an end-to-end arrangement to define said core and means for holding said discs in axial alignment.

3. The signal transmission system according to claim 2 wherein said core components are arranged for material of highest magnetic permeability positioned at said first core end and with said permeability of said components decreasing toward said second core end.

4. The signal transmission system according to claim 1, wherein the power signal has a power frequency of less than 5 Megahertz, and the transmission signal has a frequency between approximately 5 Megahertz and 1 Gigahertz.

5. The signal transmission system according to claim 1, wherein the coiled conductor is wound around a portion of the core with a gap between each turn of the winding.

6. The signal transmission system according to claim 1, wherein the coiled conductor is a single coiled conductor.

7. The signal transmission system according to claim 1, wherein each of the dielectric spacers has an outside diameter less than an outside diameter of the core.

8. The signal transmission system according to claim 1, wherein each of the dielectric spacers has a longitudinal hole aligned with the longitudinal hole of the core, the longitudinal hole of the dielectric spacers having an inside diameter which matches an inside diameter of the longitudinal hole of the core.

* * * * *

UNITED STATES PATENT AND TRADEMARK OFFICE

CERTIFICATE OF CORRECTION

PATENT NO. : 6,094,109
DATED : July 25, 2000
INVENTOR(S) : Greene et al.

It is certified that error appears in the above-identified patent and that said Letters Patent is hereby corrected as shown below:

Column 6,
Line 4, "signals" should read -- signal, --

Signed and Sealed this

Thirtieth Day of October, 2001

Attest:

Nicholas P. Godici

NICHOLAS P. GODICI

*Attesting Officer* *Acting Director of the United States Patent and Trademark Office*